US005302871A

United States Patent [19]
Matsuzaki et al.

[11] Patent Number: 5,302,871
[45] Date of Patent: Apr. 12, 1994

[54] DELAY CIRCUIT

[75] Inventors: Yukiya Matsuzaki; Yasushi Sato, both of Kawasaki; Masaharu Kawauchi, Yokohama, all of Japan

[73] Assignee: Kabushiki Kaisha Toshiba, Kawasaki, Japan

[21] Appl. No.: 929,521

[22] Filed: Aug. 14, 1992

[30] Foreign Application Priority Data

Aug. 27, 1991 [JP] Japan .................................. 3-214955

[51] Int. Cl.[5] .......................................... H03K 19/094
[52] U.S. Cl. .................................... 307/605; 307/602; 307/603
[58] Field of Search ............... 307/602, 603, 605, 572, 307/270

[56] References Cited

U.S. PATENT DOCUMENTS

| 4,700,089 | 10/1987 | Fujii et al. | 307/603 |
| 4,786,824 | 11/1988 | Masuda | 307/602 |
| 4,833,342 | 5/1989 | Kiryu et al. | 307/605 |
| 4,983,857 | 1/1991 | Steele | 307/603 |
| 5,068,553 | 11/1991 | Love | 307/605 |
| 5,128,567 | 7/1992 | Tanaka et al. | 307/572 |
| 5,130,564 | 7/1992 | Sin | 307/572 |
| 5,164,621 | 11/1992 | Miyamoto | 307/572 |
| 5,229,667 | 7/1993 | Shimizu | 307/605 |
| 5,231,319 | 7/1993 | Crafts et al. | 307/603 |

Primary Examiner—John T. Kwon
Attorney, Agent, or Firm—Oblon, Spivak, McClelland, Maier & Neustadt

[57] ABSTRACT

The present invention relates to a delay circuit comprising an input terminal, a first MOS transistor series including at least two MOS transistors of a first conductivity type whose current paths are connected to one another and whose gates are connected to the input terminal, a second MOS transistor series including at least two MOS transistors of a second conductivity type whose current paths are connected to one another and whose gates are connected to the input terminal, an output terminal connected to a connection point of the first and second MOS transistor series, a first power supply serving as a current supplier of the first MOS transistor series, and a second power supply serving as a current discharger of the second MOS transistor series.

18 Claims, 20 Drawing Sheets

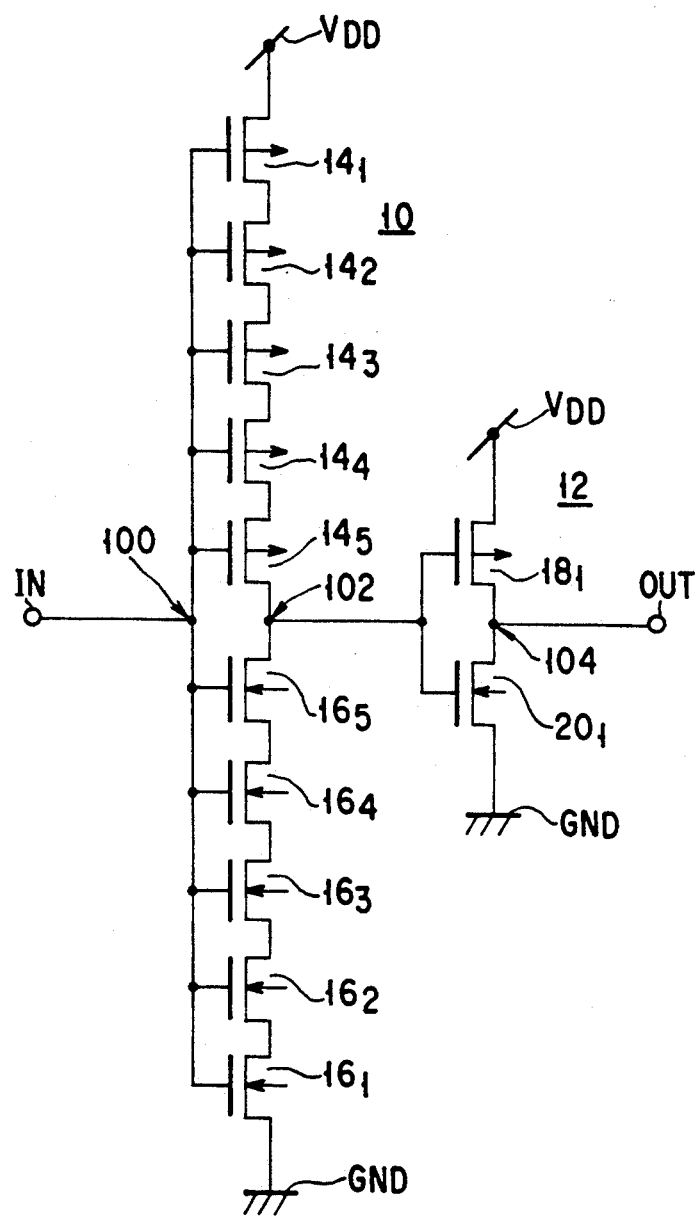
F I G. 1

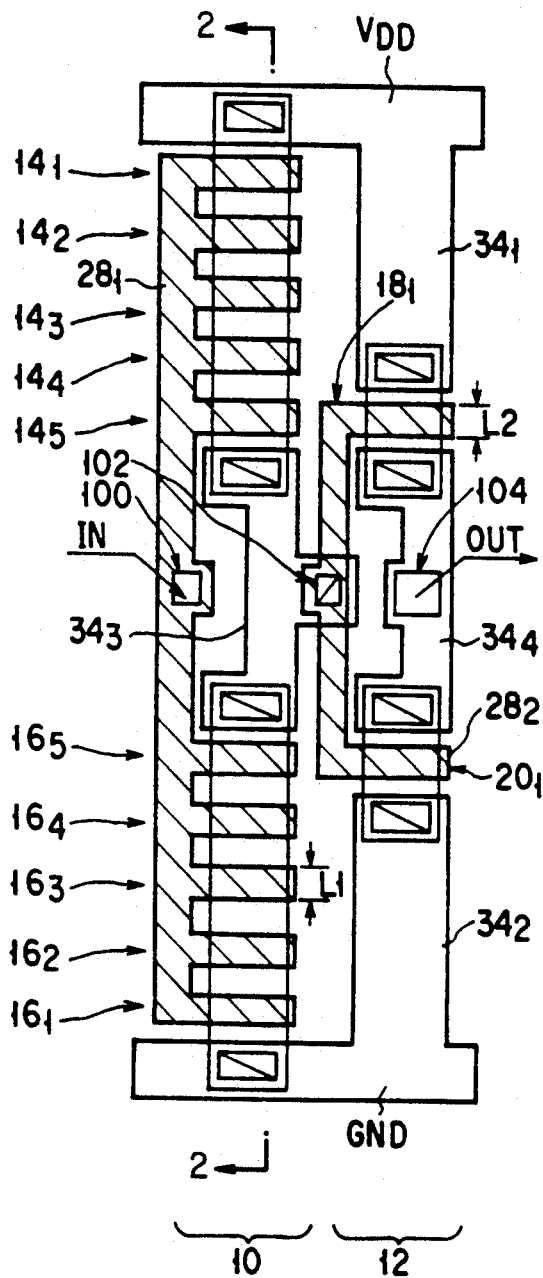 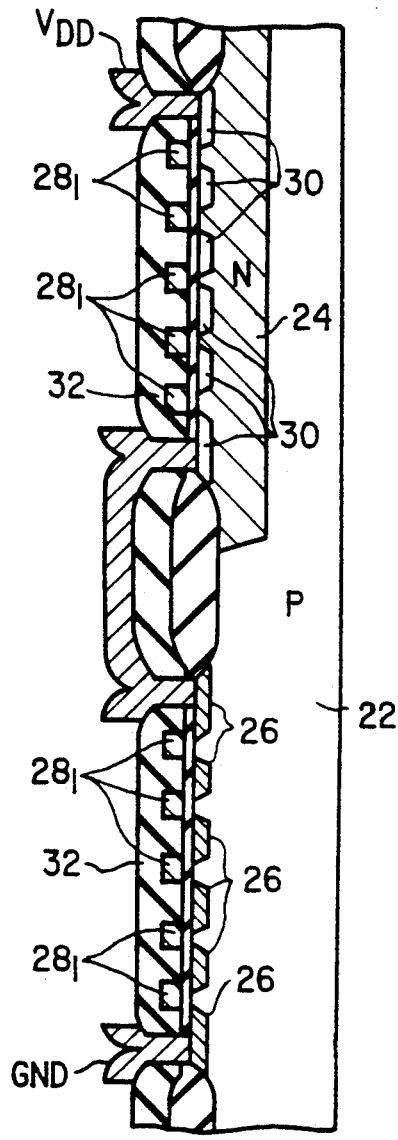
F I G. 2A          F I G. 2B

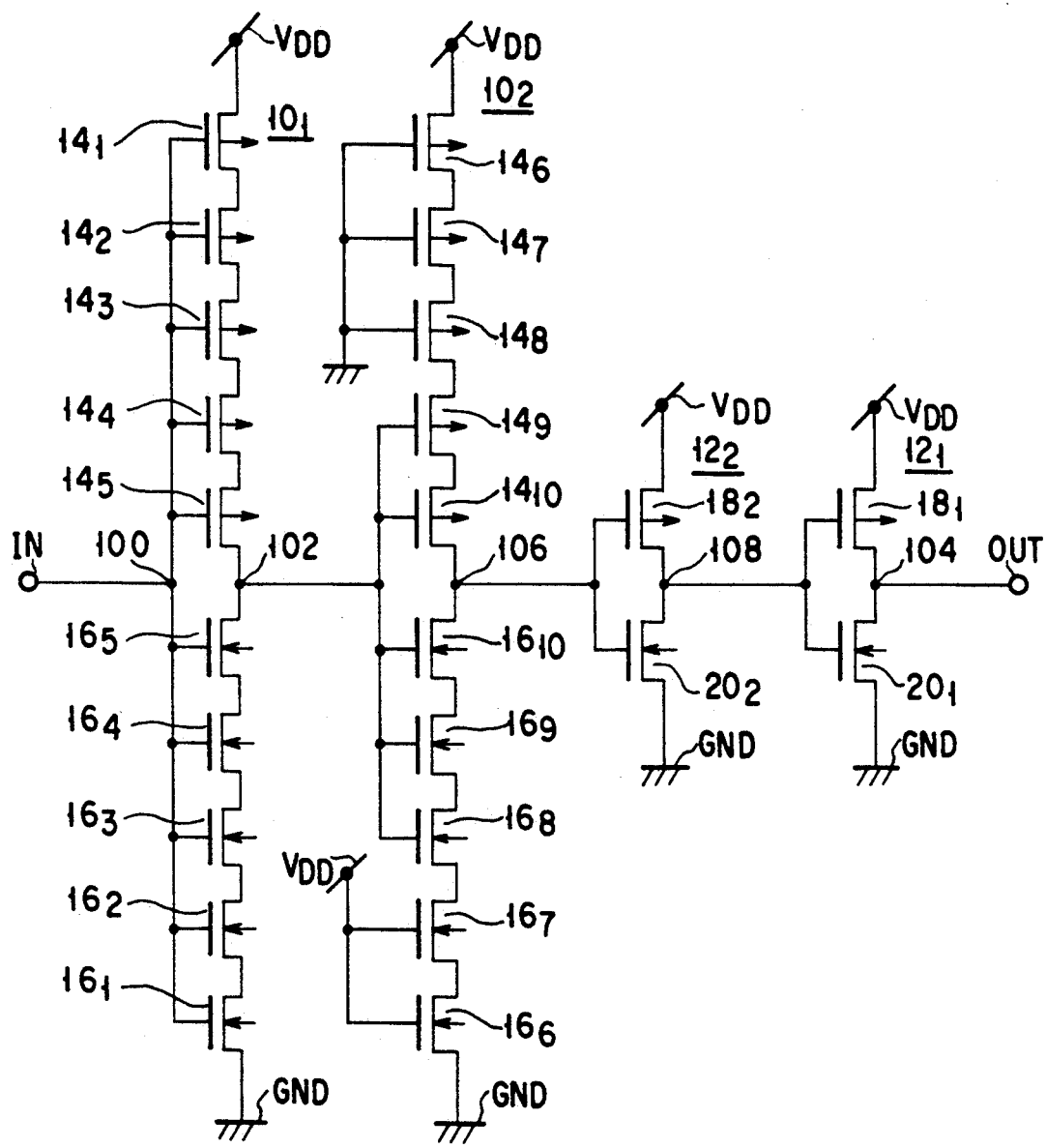
F I G. 14

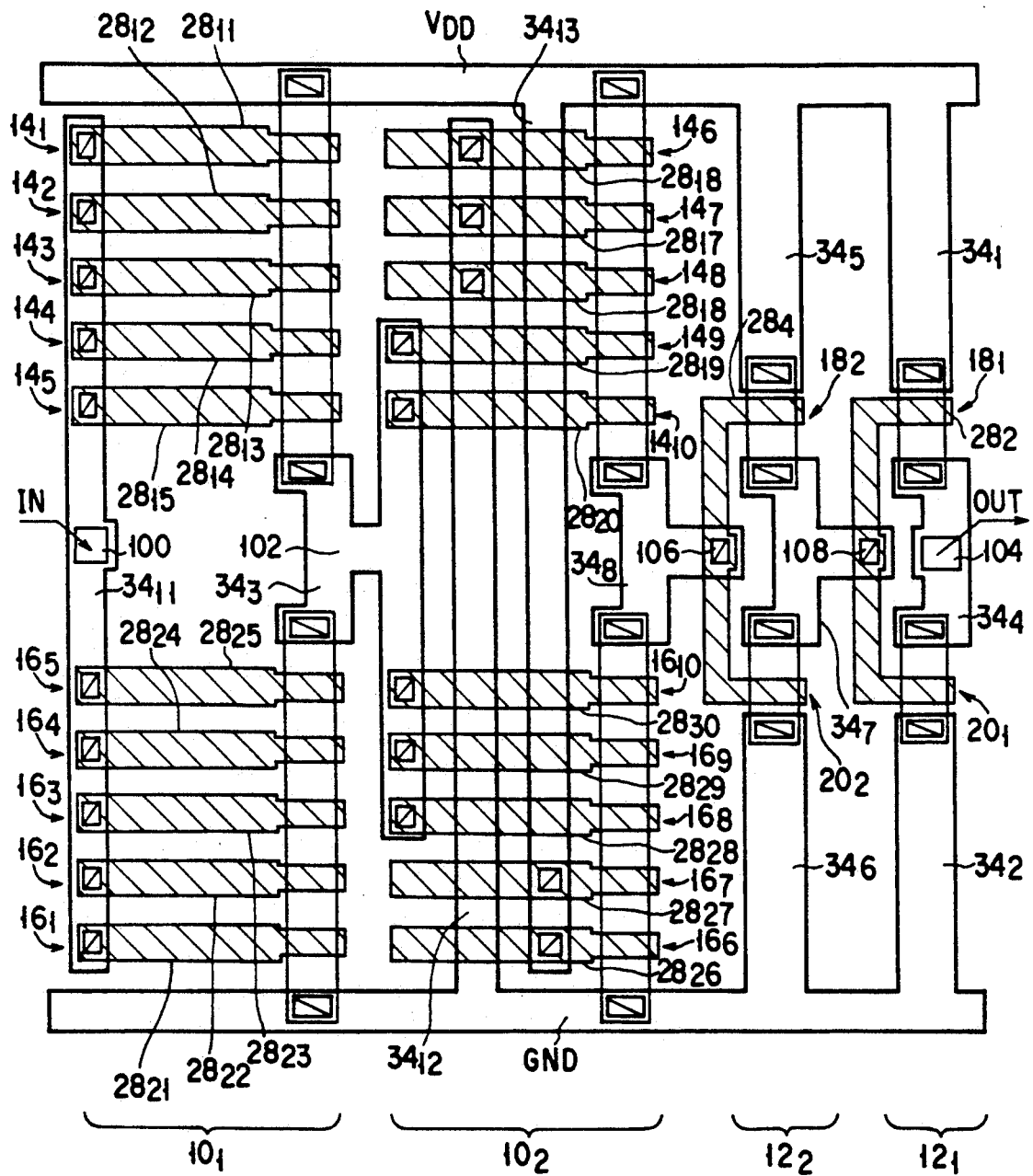
F I G. 15

DELAY CIRCUIT

BACKGROUND OF THE INVENTION

1. Field of the Invention

The present invention relates to a delay circuit for delaying a signal by a predetermined period of time.

2. Description of the Related Art

FIG. 18 is a block diagram of a conventional delay circuit, FIG. 19 is a circuit diagram thereof, and FIG. 20 is a pattern plan view of the delay circuit formed as an integrated circuit.

As shown in FIGS. 8–20, a plurality of inverters 200 are connected in cascade between an input terminal IN and an output terminal OUT, and each of the inverters has a delay time which depends upon the on-resistance of transistors 202 and 204 and the capacitance added to an output signal of the inverter. Since, however, the conventional delay circuit includes the plural inverters 200, its pattern area is considerable, as shown in FIG. 20.

To reduce the size of the pattern area, the number of the inverters can be decreased by increasing the time constant of each of the inverters incorporated in the circuit, and lengthening the delay time thereof. A delay circuit having a decreased number of inverters is shown in FIG. 21, in which the gates of MOSFETs 202 and 204 constituting an inverter 200 are lengthened to increase the time constant of the inverter. However, lengthening the gates is not in itself a solution to reducing the pattern area. If the gates are lengthened too much, dispersion of parameters of semiconductor devices occurs.

When a mask shrink rate is changed in a delay circuit of MOS FETs each having a long gate length, the rate of variation in delay time does not conform to that of the other circuits. More specifically, if a mask is shrunk, the delay time is changed. For this reason, when the mask shrink rate is changed, the delay circuit has to be redesigned to ensure its proper operation, which increases the circuit development time.

FIGS. 22 and 23 show other conventional delay circuits. The delay circuit shown in FIG. 22 includes a capacitor C, while that shown in FIG. 23 includes a resistor R. Since the capacitor and resistor differ from other circuit elements, i.e., MOS FETs in their influence of dispersion of parameters of semiconductor devices, the delay time of signals deviates from a set value, or the delay circuits do not perform their operations perfectly.

As described above, the conventional delay circuits have to have a large pattern area in order to obtain the desired signal delay time, and thus the pattern area per delay time is enlarged. Further, they have drawbacks in that the parameters of semiconductor devices can easily vary in the process of manufacturing an integrated circuit, changing the delay time if the shrink rate of a mask for manufacturing the integrated circuit changes.

SUMMARY OF THE INVENTION

The present invention has been developed in order to overcome the above drawbacks and its object is to provide a delay circuit in which the pattern area per delay time is reduced, ensure proper circuit operation even when dispersion of parameters of semiconductor devices occurs in the process of manufacturing semiconductor circuits, and in which it is not necessary for the delay time to conform with that of other circuits.

In a delay circuit according to the present invention, a current path of a plurality of P-channel MOS FETs and that of a plurality of N-channel MOS FETs are connected in series between first and second power supplies, an input signal is supplied to the gates of the P- and N-channel MOS FETs, and an output signal is generated from a connection point of the current paths. The P-channel MOS FETs are connected in series between the first power supply and the connection point, and the N-channel MOS FETs are connected in series between the connection point and the second power supply.

In the delay circuit having the above arrangement, the delay time can be increased, since the P- and N-channel MOS FETs are connected between the first and second power supplies. The pattern area of the delay circuit can be reduced to a greater extent than in the case of a delay circuit in which a plurality of inverters each having a single P-channel MOS FET and a plurality of inverters each having a single N-channel MOS FET are connected to one another. Therefore, in the present invention, the pattern area per delay time can be reduced significantly.

Since the delay circuit is constituted by the P- and N-channel MOS FETs only, i.e., without using any capacitors or resistors, the parameters of semiconductor devices cannot easily vary. Therefore, the possibility of the delay time deviating from a set value due to variation in the parameters and thus of an operation being performed incorrectly is drastically decreased.

If an inverter constituted by MOS FETs each having a long gate length is shrunk, its delay time will differ considerably in variation rate from that of other logic circuits. However, the MOS FETs of the delay circuit can be designed to have the same gate length as that of MOS FETs constituting other circuits, with the result that the delay time of the delay circuit will not differ greatly in variation rate from that of the other logic circuits, even if the MOS FETs are shrunk.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a delay circuit according to a first embodiment of the present invention;

FIGS. 2A and 2B are views of the delay circuit shown in FIG. 1 which is formed as an integrated circuit, FIG. 2A showing a pattern plan view thereof and FIG. 2B showing a cross-sectional view taken along a line b—b of FIG. 2A;

FIG. 14 is a circuit diagram of a delay circuit according to a sixth embodiment of the present invention, wiring of which differs from that of the delay circuit shown in FIG. 12;

FIG. 15 is a pattern plan view of the delay circuit shown in FIG. 14 which is formed as an integrated circuit;

DETAILED DESCRIPTION OF THE PREFERRED EMBODIMENTS

Figure 3:
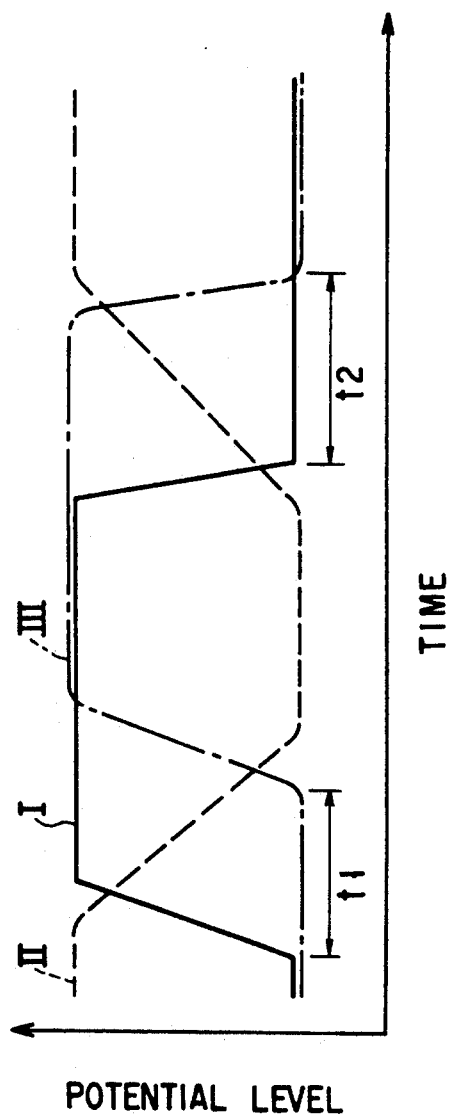
FIG. 3 is a view of signal waveforms showing an operation of the delay circuit shown in FIG. 1.

Embodiments of the present invention will now be described, with reference to the accompanying drawings.

FIG. 1 is a circuit diagram of a delay circuit according to a first embodiment of the present invention.

As shown in FIG. 1, a first inverter 10 and a second inverter 12 are connected in cascade between an input terminal IN and an output terminal OUT. The first inverter 10 includes P-channel MOS FETs (hereinafter referred to as PMOS) $14_1$ to $14_5$ and N-channel MOS FETs (hereinafter referred to as NMOS) $16_1$ to $16_5$. The gates of the PMOS $14_1$ to $14_5$ are connected to one another, and the gates of the NMOS $16_1$ to $16_5$ are also connected to one another. The former gates and the latter gates are connected to each other at a node 100 to which the input terminal IN is connected. The source of the PMOS $14_1$ is connected to a power supply VDD. The source of the PMOS $14_2$ is connected to the drain of the PMOS $14_1$. Similarly, the source of the PMOS $14_3$ is connected to the drain of the PMOS $14_2$, the source of the PMOS $14_4$ is connected to the drain of the PMOS $14_3$, and the source of the PMOS $14_5$ is connected to the drain of the PMOS $14_4$. As a result, the PMOS $14_1$ to $14_5$ constitute a series five-stage circuit. The drain of the PMOS $14_5$ is connected to that of the NMOS $16_5$. The source of the NMOS $16_5$ is connected to the drain of the NMOS $16_4$. Similarly, the source of the NMOS $16_4$ is connected to the drain of the NMOS $16_3$, the source of the NMOS $16_3$ is connected to the drain of the NMOS $16_2$, and the source of the NMOS $16_2$ is connected to the drain of the NMOS $16_1$. As a result, the NMOS $16_1$ to $16_5$ constitute a series five-stage circuit. The source of the NMOS $16_1$ is connected to a power supply GND. The inverter 10 constituted by these PMOS and NMOS outputs a signal from its node 102 of the drains of the PMOS $14_5$ and NMOS $16_5$.

Since the inverter 100 includes the five MOS FETs whose current paths are connected in series between the node 102 serving as an output terminal and the power supply VDD or GND, five resistors can be inserted therebetween, with the result that delay time can be effectively obtained.

In the first embodiment, an inverter 12, which includes a PMOS $18_1$ and an NMOS $20_1$ connected in series between power supplies VDD and GND, is connected between the node 102 and the output terminal OUT. Both the gates of the PMOS $18_1$ and NMOS $20_1$ are connected to the node 102 of the inverter 10. The inverter 12 outputs a signal from its node 104 of the drains of the PMOS $18_1$ and NMOS $20_1$, and the node 104 is connected to the output terminal OUT.

The inverter 12 is arranged to shape the waveform of an output signal and is dispensable. More specifically, since a high resistance is added between the power supply and the output terminal in the inverter 10, the rise/fall time of an output signal is lengthened, and the waveform of the output signal becomes dull. If the inverter 12, whose resistance is low between the power supply and the output terminal, is arranged on the stage posterior to the inverter 10, the rise/fall time of the output signal can be shortened, with the result that the dull waveform of the output signal can be improved.

FIGS. 2A and 2B show the delay circuit shown in FIG. 1 which is formed as an integrated circuit. FIG. 2A is a pattern plan view thereof and FIG. 2B is a cross-sectional view taken along line b—b in FIG. 2A. In FIGS. 2A and 2B, the same elements as those in FIG. 1 are denoted by the same reference numerals and their descriptions are omitted.

As shown in FIG. 2A, the channels of all the PMOS and NMOS constituting the inverters 10 and 12 have the same lengths $L_1$ and $L_2$.

As shown in FIG. 2B, an N-type well region 24 is formed in a P-type silicon substrate 22, a plurality of N-type diffusion layers 26 is formed in a surface region of the substrate 22, and a plurality of P-type diffusion layers 30 is formed in the surface region of the well region 24. The diffusion layers 26 serve as source/drain diffusion regions of the NMOS, and the diffusion layers 30 serve as those of the PMOS. Gate electrodes $28_1$ and $28_2$ of polysilicon layers are formed between the diffusion layers 26 and between the diffusion layers 30 on the substrate 22, and are covered with interlayer insulation films 32. First-layer aluminum alloy wiring layers $34_1$ to $34_4$, and includes a power line between the power supplies VDD and GND, a wiring layer for connecting the output terminal of the inverter 10 and the input terminal of the inverter 12, and a wiring layer serving as the output terminal of the inverter 12.

FIG. 3 shows waveforms of signals representing an operation of the delay circuit shown in FIG. 1.

In FIG. 3, lines I, II, and III indicate a variation in voltage of the node 100 (input terminal IN) shown in FIG. 1, a variation in voltage of the node 102 shown in FIG. 1, and a variation in voltage of the node 104 (output terminal OUT) shown in FIG. 1, respectively.

As shown in FIG. 3, in the delay circuit according to the first embodiment, the rise time of the voltage of the output terminal can be delayed by t1 from that of the voltage of the input terminal I, and the fall time of the voltage of the output terminal OUT can be delayed by t2 from that of the voltage of the input terminal I.

Figure 4:
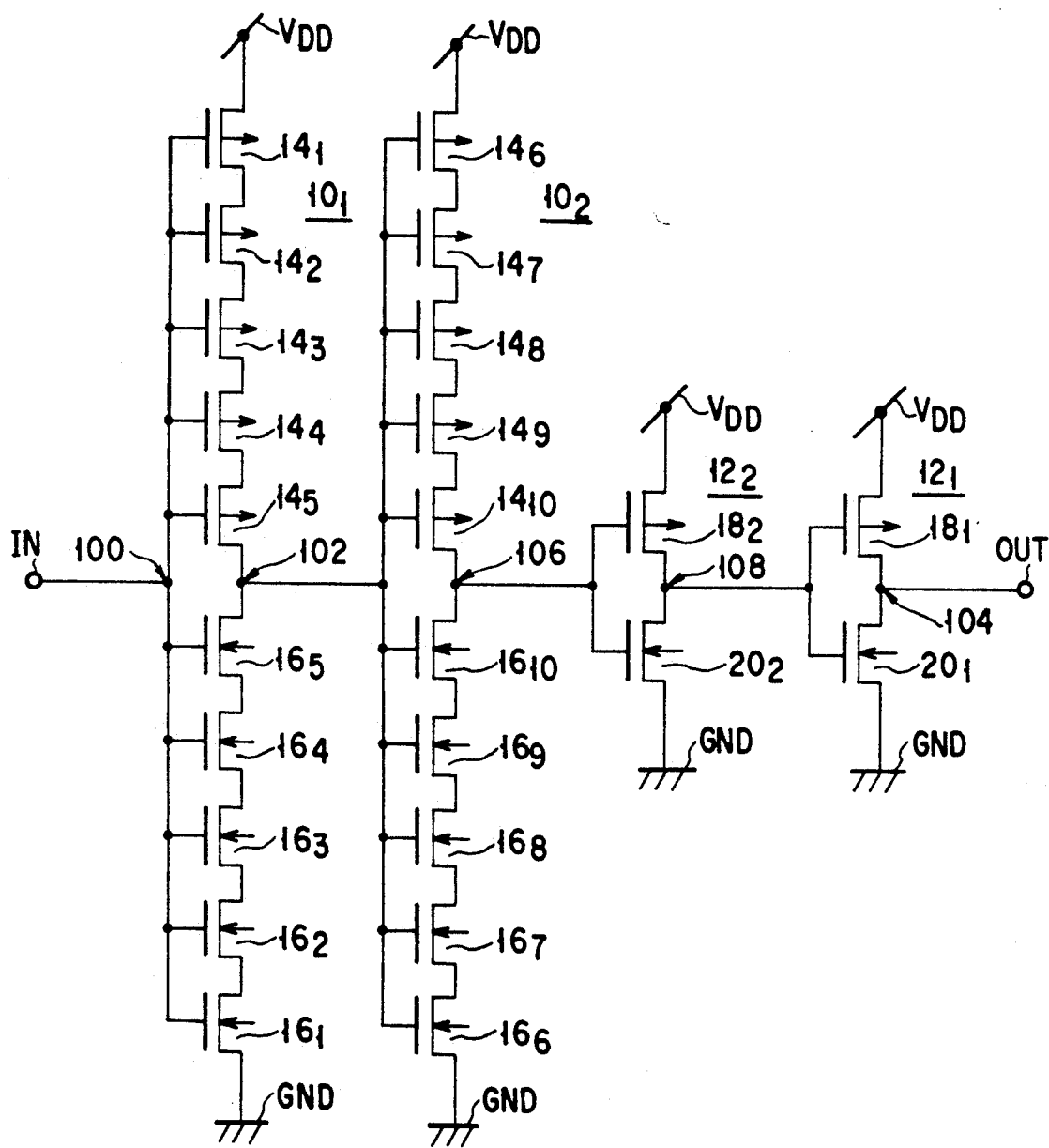
FIG. 4 is a circuit diagram of a delay circuit according to a second embodiment of the present invention.

FIG. 4 is a circuit diagram of a delay circuit according to a second embodiment of the present invention. In the second embodiment, a plurality of inverters $10_1$ and $10_2$, each of which includes a plurality of MOS FETs between the power supply and the output terminal as in the first embodiment, is connected between the input terminal IN and the output terminal OUT.

As shown in FIG. 4, the input terminal of the inverter $10_1$ including PMOS $14_1$ to $14_5$ and NMOS $16_1$ to $16_5$ is connected to the input terminal IN, and the input terminal of the inverter $10_2$ including PMOS $14_6$ to $14_{10}$ and NMOS $16_6$ to $16_{10}$ is connected to the output terminal of the inverter $10_1$. Further, the input terminal of an inverter $12_2$ including a PMOS $18_2$ and an NMOS $20_2$ is connected to the output terminal of the inverter $10_2$, and the input terminal of an inverter $12_1$ including a PMOS $18_1$ and an NMOS $20_1$ is connected to the output terminal of the inverter $12_2$. The output terminal of the inverter $12_1$ is connected to the output terminal OUT.

Figure 5:
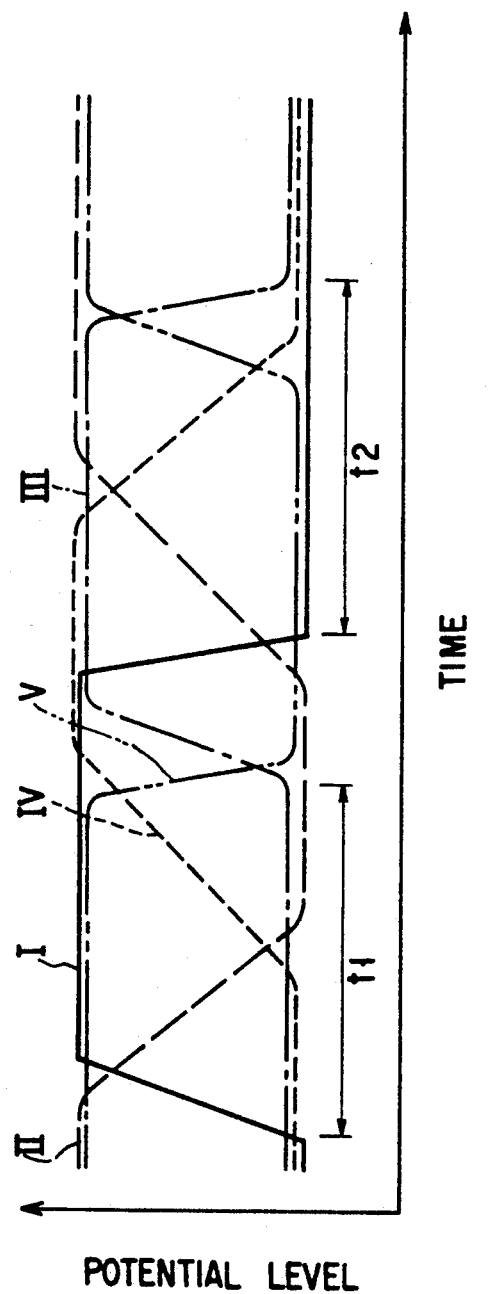
FIG. 5 is a view of signal waveforms showing an operation of the delay circuit shown in FIG. 4.

FIG. 5 shows waveforms of signals representing an operation of the delay circuit shown in FIG. 4. In FIG. 5, lines I, II, III, IV, and V indicate a variation in voltage of the node 100 (input terminal IN) shown in FIG. 4, a variation in voltage of the node 102 shown in FIG. 1, a variation in voltage of the node 104 (output terminal OUT) shown in FIG. 4, a variation in voltage of the node 106 shown in FIG. 4, and a variation in voltage of the node 108 shown in FIG. 4, respectively.

Since, in the delay circuit according to the second embodiment, a plurality of inverters $10_1$ and $10_2$ is connected between the input terminal IN and the output terminal OUT, the delay time t1 and t2 can be set longer than in the delay circuit according to the first embodiment, as shown in FIG. 5.

Figure 6:
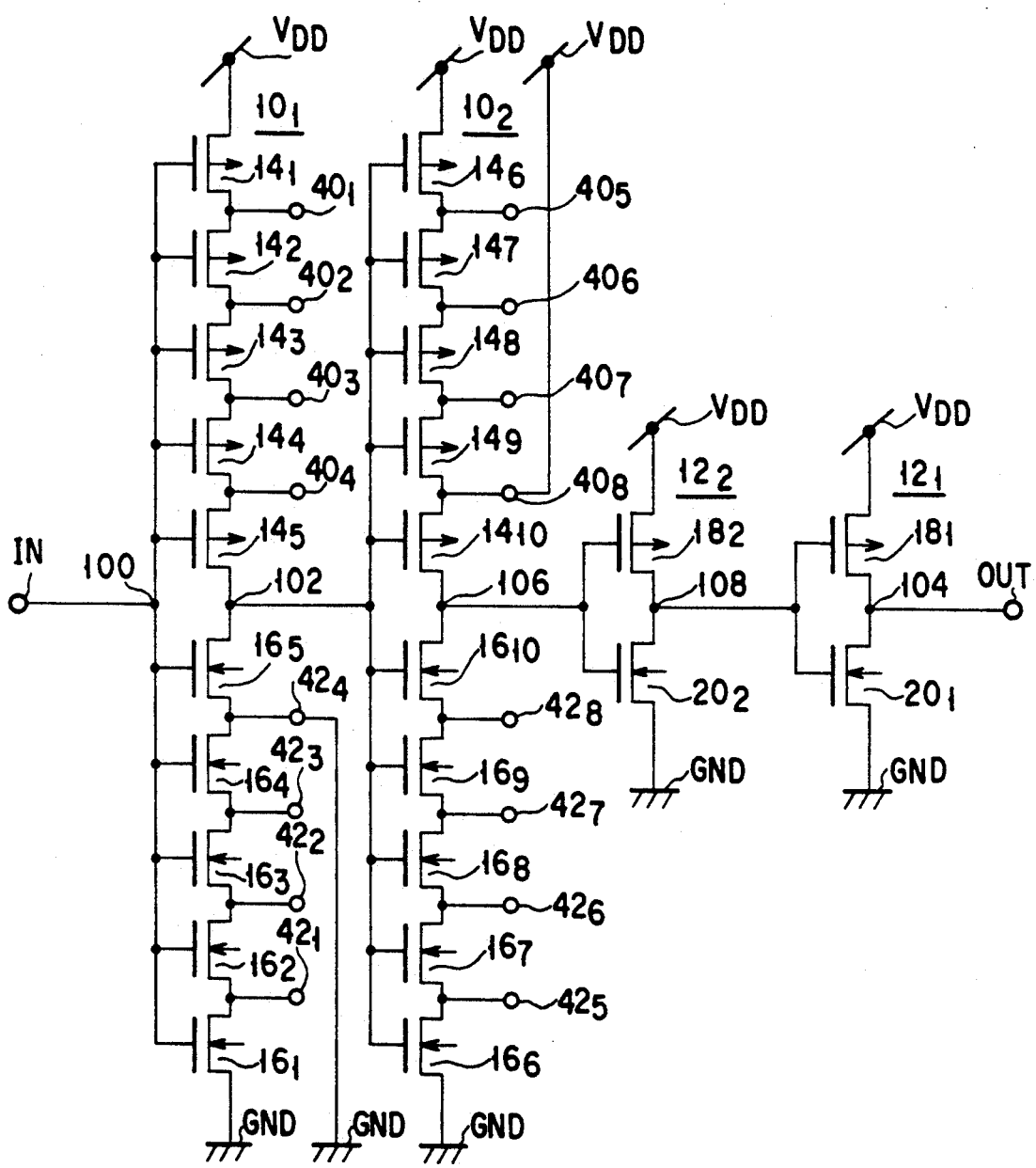
FIG. 6 is a circuit diagram of a delay circuit according to a third embodiment of the present invention.
Figure 7:
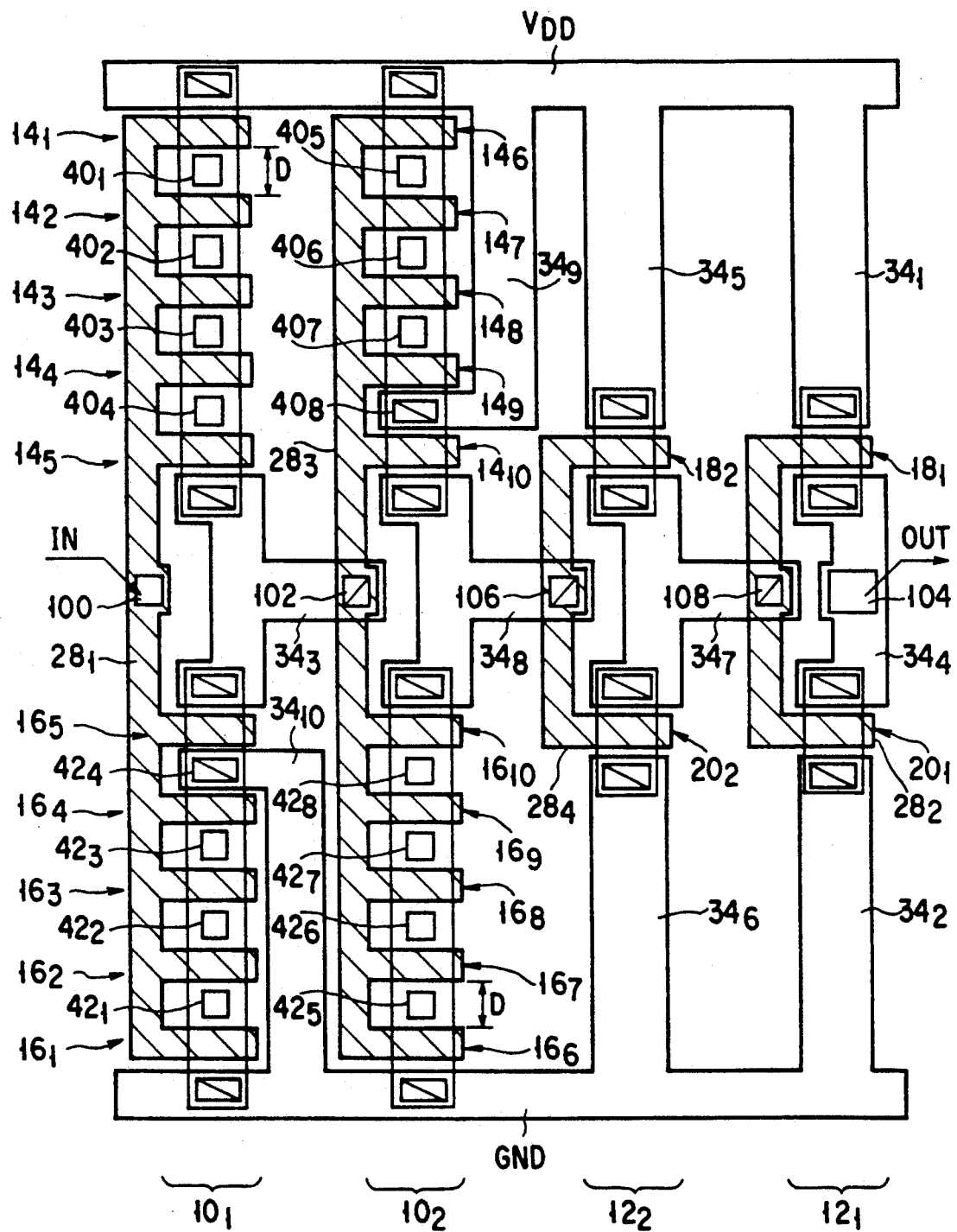
FIG. 7 is a pattern plan view of the delay circuit shown in FIG. 6 which is formed as an integrated circuit.

FIG. 6 is a circuit diagram of a delay circuit according to a third embodiment of the present invention, and FIG. 7 is a pattern plan view of the delay circuit shown in FIG. 6 which is formed as an integrated circuit.

According to the third embodiment, the inverters $10_1$ and $10_2$ each include a plurality of PMOS and NMOS connected between the power supply and the output terminal. Terminals $40_1$ to $40_8$ are connected between the sources and drains of the PMOS, and terminals $42_1$ to $42_8$ are connected between the sources and drains of the NMOS. The power lines VDD and GND are connected to these terminals and therefore the delay time of the inverters $10_1$ and $10_2$ can be controlled.

In order to form the terminals $40_1$ to $40_8$ and $42_1$ to $42_8$ on the semiconductor substrate, spaces D of the gate electrodes 28 of polysilicon layers in the PMOS $14_1$ to $14_{10}$ and NMOS $16_1$ to $16_{10}$ have only to be enlarged so that first-layered aluminum alloy wiring layers $34_9$ and $34_{10}$ can be put into contact with the source/drain diffusion layers.

Figure 8:
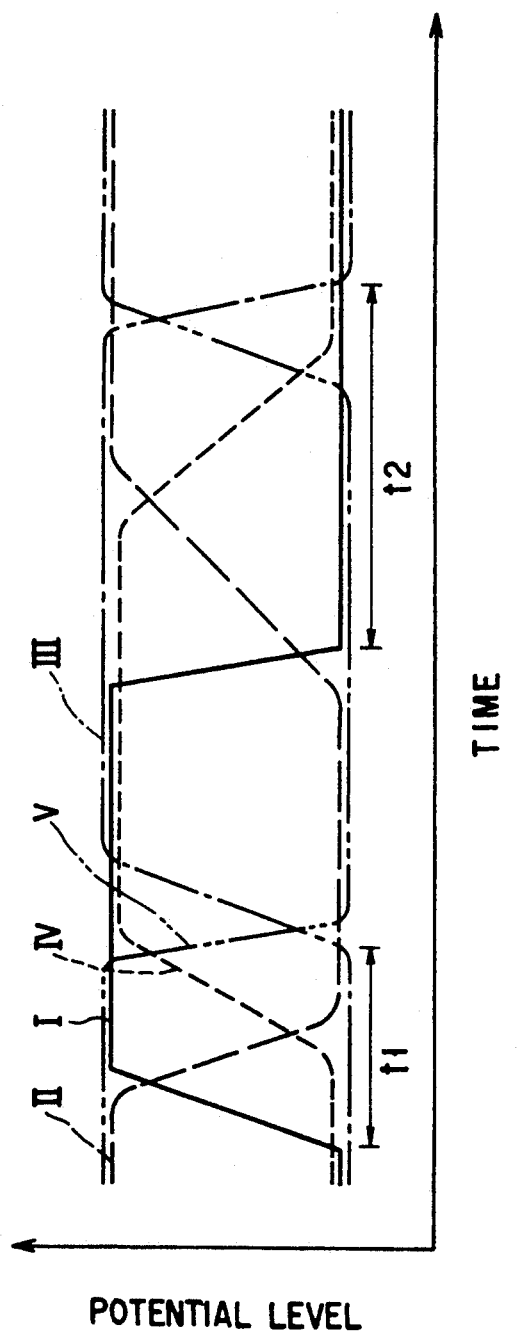
FIG. 8 is a view of signal waveforms showing an operation of the delay circuit shown in FIG. 6.

FIG. 8 shows waveforms of signals representing an operation of the delay circuit shown in FIG. 6. In FIG. 8, lines I, II, III, IV, and V indicate a variation in voltage of the node 100 (input terminal IN) shown in FIG. 6, a variation in voltage of the node 102 shown in FIG. 6, a variation in voltage of the node 104 (output terminal OUT) shown in FIG. 6, a variation in voltage of the node 106 shown in FIG. 6, and a variation in voltage of the node 108 shown in FIG. 6, respectively.

As shown in FIG. 8, in the delay circuit according to the third embodiment, the power line VDD is connected to the terminal $40_8$ connected between the drain of the PMOS $14_9$ and the source of the PMOS $14_{10}$ both constituting the inverter $10_2$, and the power line GND is connected to the terminal $42_4$ connected between the drain of the NMOS $16_4$ and the source of the NMOS $16_5$ both constituting the inverter $10_1$, with the result that the delay time t1 at the rise of the signals can be shorter than in the delay circuit according to the second embodiment.

Figure 9:
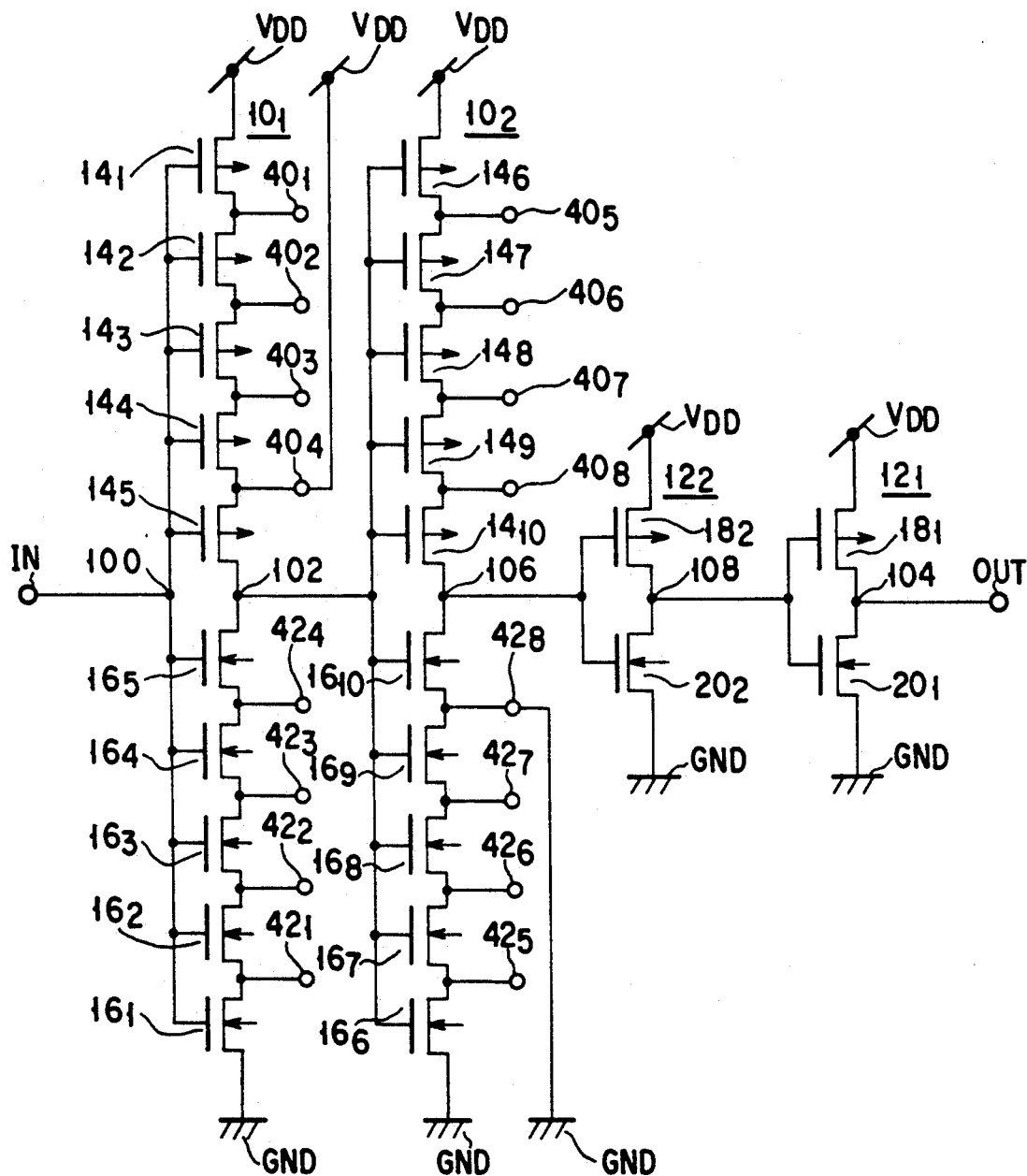
FIG. 9 is a circuit diagram of a delay circuit according to a fourth embodiment of the present invention, wiring of which differs from that of the delay circuit shown in FIG. 6.
Figure 10:
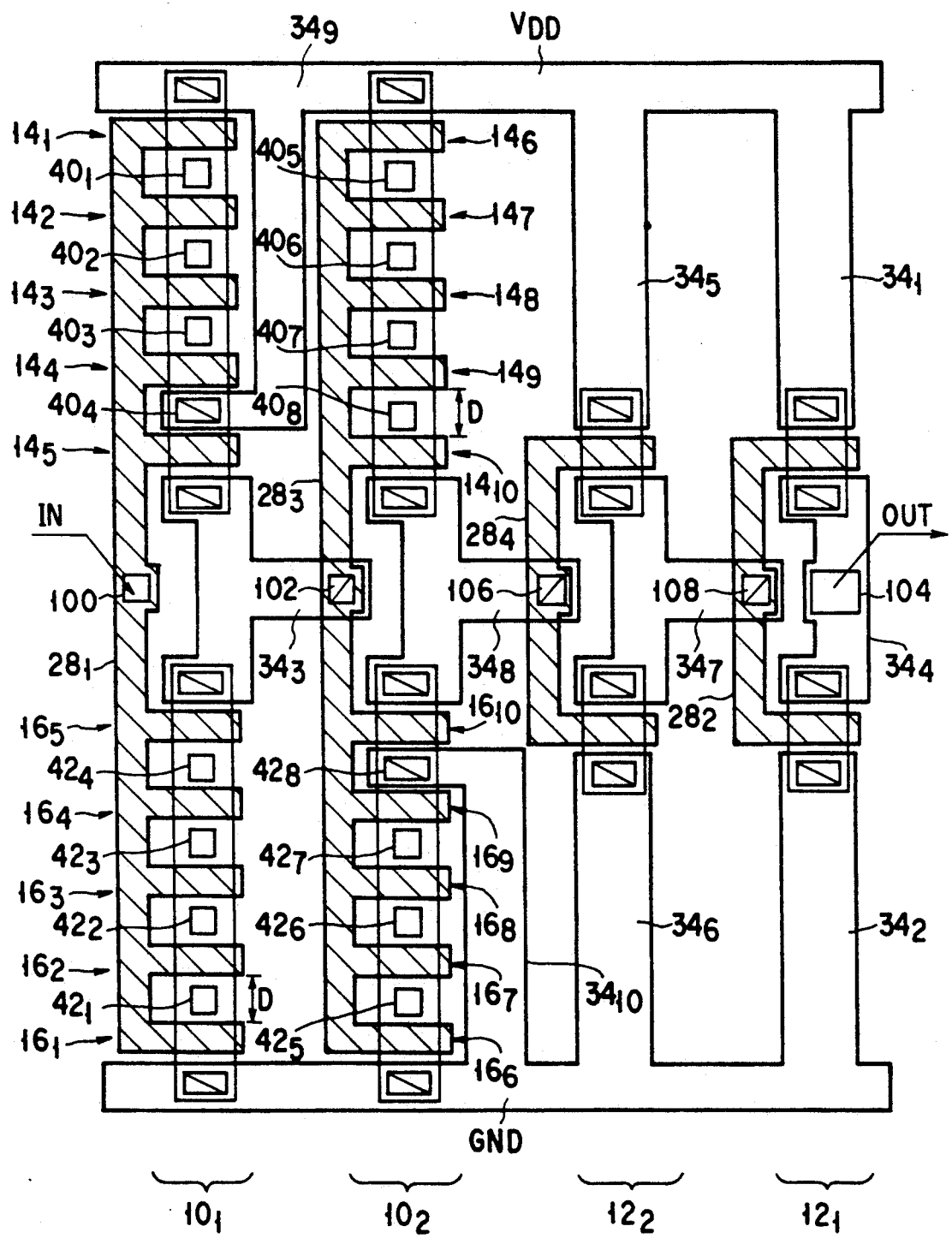
FIG. 10 is a pattern plan view of the delay circuit shown in FIG. 9 which is formed as an integrated circuit.

FIG. 9 is a circuit diagram of a delay circuit according to a fourth embodiment of the present invention, wiring of which differs from that of the delay circuit shown in FIG. 6. FIG. 10 is a pattern plan view of the delay circuit shown in FIG. 9 which is formed as an integrated circuit.

As shown in FIG. 9, the power line VDD is connected to the terminal $40_4$ arranged between the drain of the PMOS $14_4$ and the source of the PMOS $14_5$ both constituting the inverter $10_1$, and the power line GND is connected to the terminal $42_8$ arranged between the drain of the NMOS $16_9$ and the source of the NMOS $16_{10}$ both constituting the inverter $10_2$. This wiring state can be obtained only by changing the mask pattern of first-layered aluminum alloy wiring layers $34_1$ and $34_{10}$ shown in FIG. 7 to that in FIG. 10.

Figure 11:
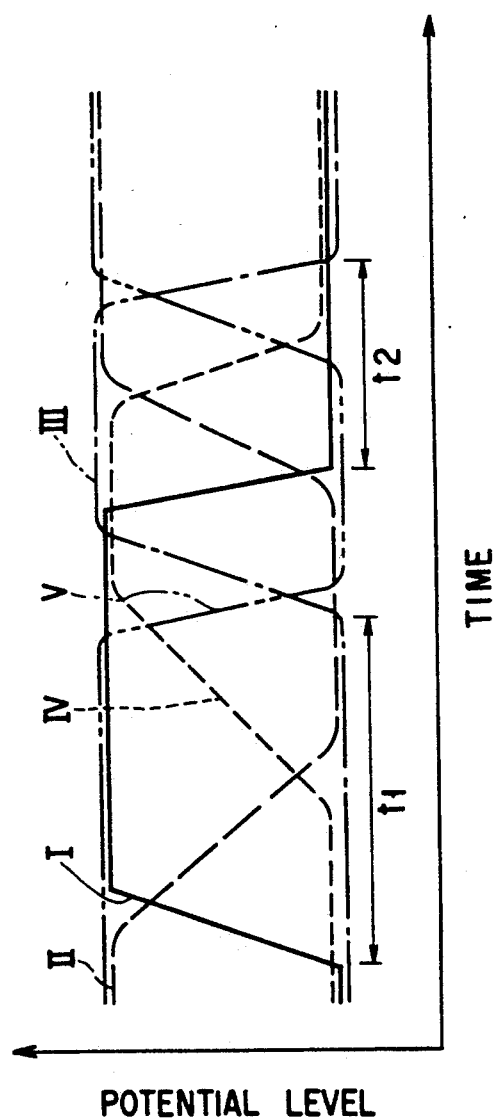
FIG. 11 is a view of signal waveforms showing an operation of the delay circuit shown in FIG. 9.

FIG. 11 shows waveforms of signals representing an operation of the delay circuit shown in FIG. 9. In FIG. 11, lines I, II, III, IV, and V indicate a variation in voltage of the node 100 (input terminal IN) shown in FIG. 9, a variation in voltage of the node 102 shown in FIG. 9, a variation in voltage of the node 104 (output terminal OUT) shown in FIG. 9, a variation in voltage of the node 106 shown in FIG. 9, and a variation in voltage of the node 108 shown in FIG. 9, respectively.

If the wiring layers are formed as shown in FIG. 9, the delay time t2 at the fall of the signals can be shorter than in the delay circuit according to the second embodiment.

Figure 12:
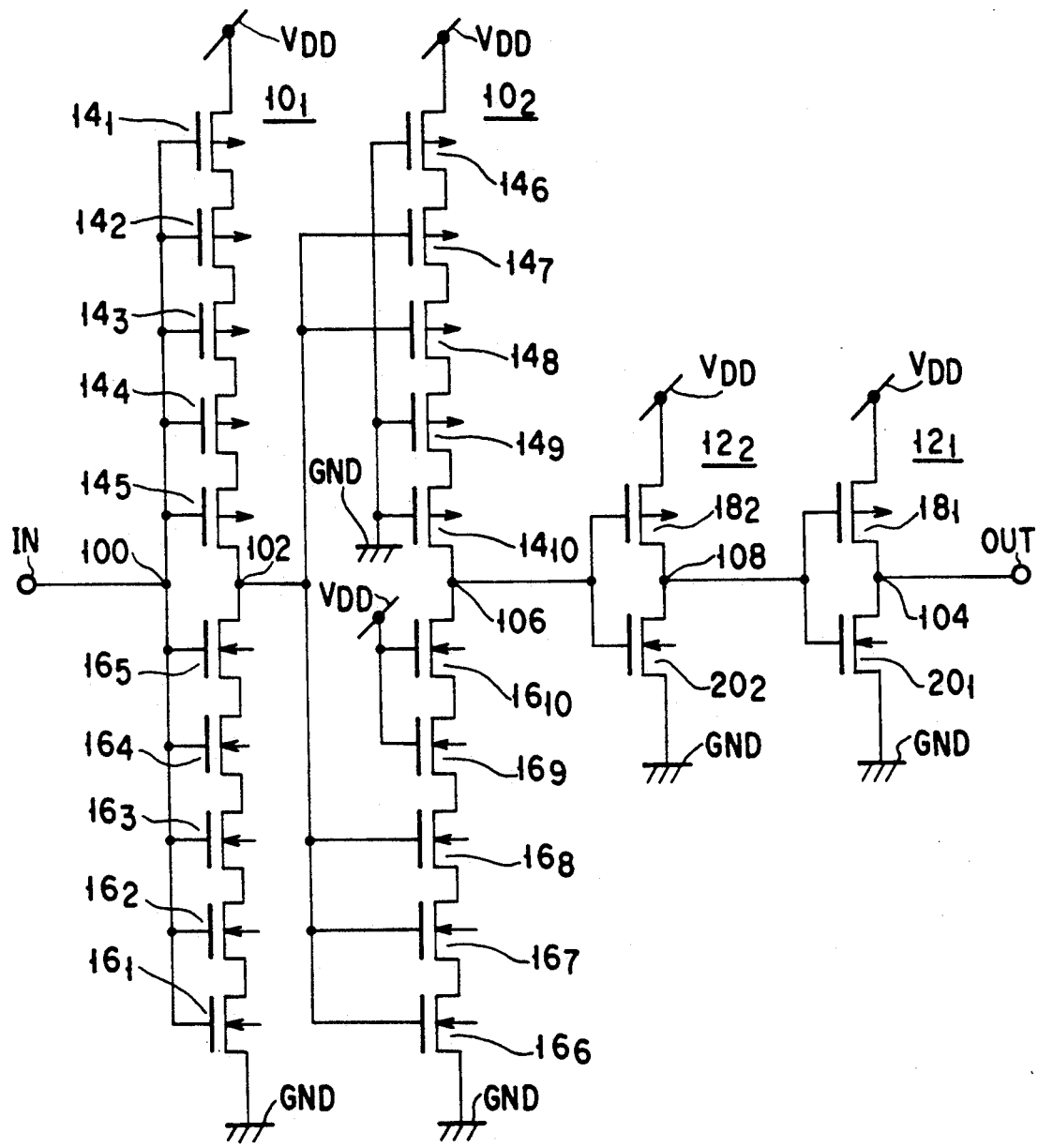
FIG. 12 is a circuit diagram of a delay circuit according to a fifth embodiment of the present invention.
Figure 13:
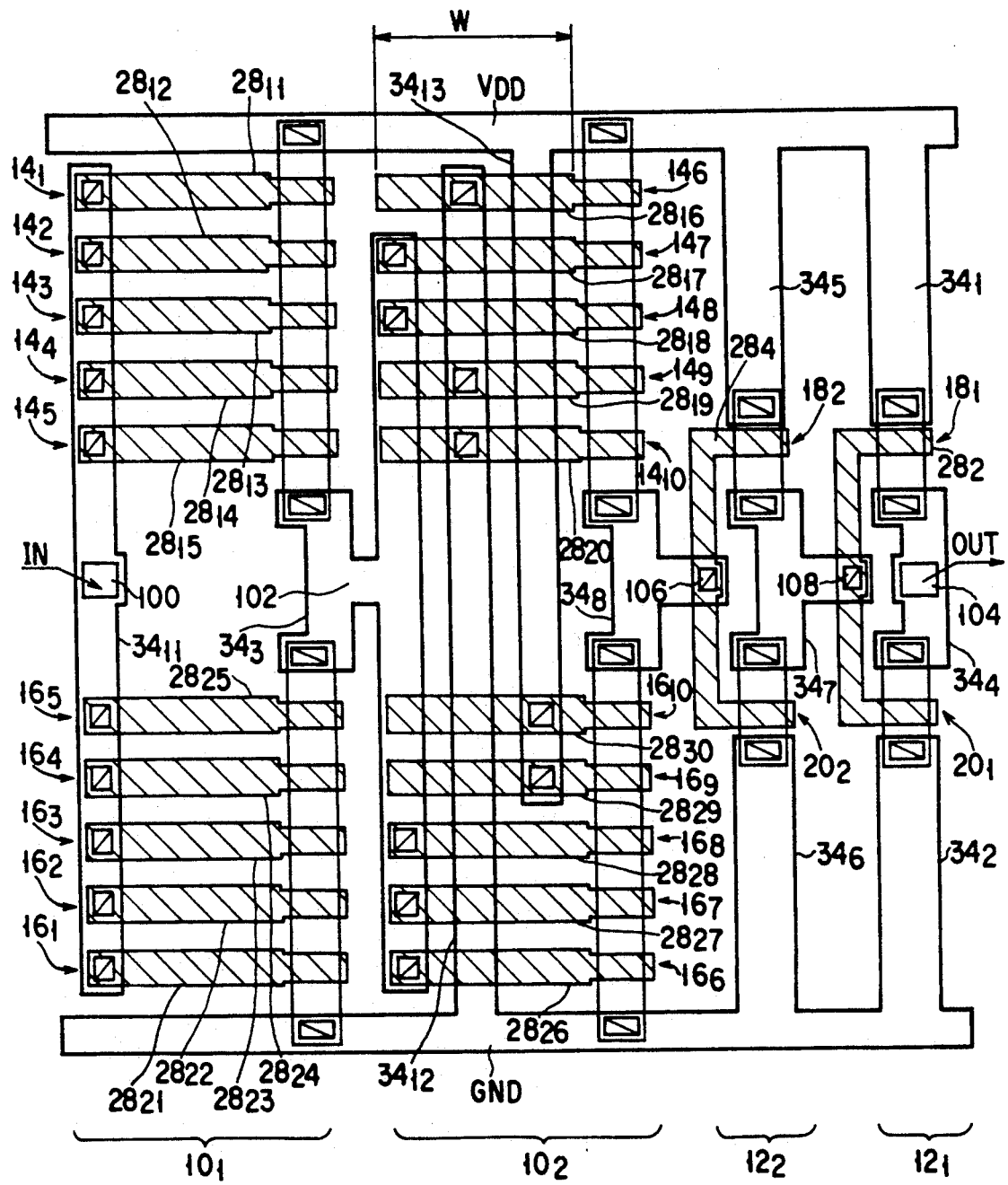
FIG. 13 is a pattern plan view of the delay circuit shown in FIG. 12 which is formed as an integrated circuit.

FIG. 12 is a circuit diagram of a delay circuit according to a fifth embodiment of the present invention, and FIG. 13 is a pattern plan view of the delay circuit shown in FIG. 12 which is formed as an integrated circuit.

According to the fourth embodiment, the delay time of the inverter $10_1$ or $10_2$ is controlled by changing the wiring states of the gates of the plural PMOS and NMOS constituting these inverters. As shown in FIG. 12, the gates of PMOS $14_6$, $14_9$, and $14_{10}$ of the inverter $10_2$ are connected to the power line GND to normally turn on the PMOS. The gates of PMOS $14_7$ and $14_8$ are connected to the node 102 to turn on/off the PMOS in response to an output signal of the inverter $10_1$. The gates of NMOS $16_9$ and $16_{10}$ are connected to the power line VDD to normally turn of the NMOS, and the gates of NMOS $16_6$, $16_7$, and $16_8$ are connected to the node 102 to turn on/off in response to an output signal of the inverter $10_1$.

If the power line VDD or GND is connected to the gates of the PMOS and NMOS, the delay time of the inverter $10_1$ or $10_2$ can be controlled as in the delay circuit according to the third embodiment.

To form the delay circuit shown in FIG. 12 as an integrated circuit, the gates $28_{11}$ to $28_{30}$ of polysilicon layers of the NMOS $16_1$ to $16_{10}$ are separated from one another, and the gates have only to have such a length W as that the aluminum alloy wiring layer $34_3$ into which an input signal flows from a circuit on the preceding stage, the aluminum alloy wiring layer $34_{12}$ having a potential of the GND, and the aluminum alloy wiring layer $34_{13}$ having a potential of the VDD can be put into contact with the gates. Like in the delay circuit according to the third embodiment, various wiring states can be obtained only by changing the mask pattern of the aluminum alloy wiring layers $34_1$ to $34_8$ and $34_{11}$ to $34_{13}$.

FIG. 14 is a circuit diagram of a delay circuit according to a sixth embodiment of the present invention, whose wiring differs from that of the delay circuit shown in FIG. 12. FIG. 15 is a pattern plan view of the delay circuit shown in FIG. 14 which is formed as an integrated circuit. In FIGS. 14 and 15, the same elements as those in FIGS. 12 and 13 are indicated by the same reference numerals and their descriptions are omitted.

Figure 16:
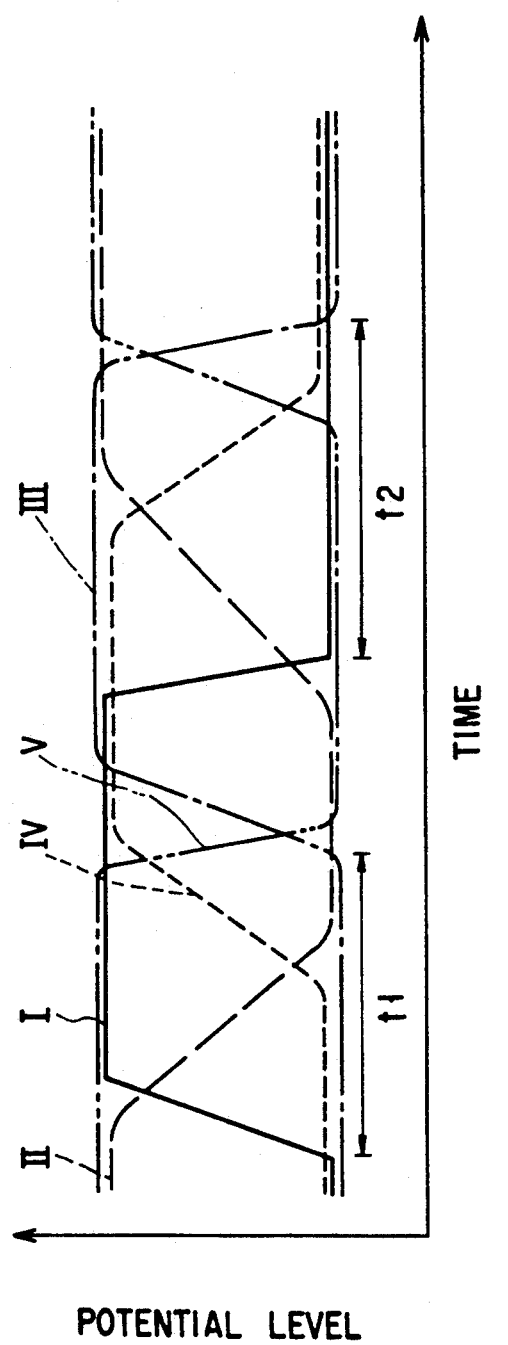
FIG. 16 is a view of signal waveforms showing an operation of the delay circuit shown in FIG. 12.

FIG. 16 shows waveforms of signals representing an operation of the delay circuit shown in FIG. 12. In FIG. 16, lines I, II, III, IV, and V indicate a variation in voltage of the node 100 (input terminal IN) shown in FIG. 12, a variation in voltage of the node 102 shown in FIG. 12, a variation in voltage of the node 104 (output terminal OUT) shown in FIG. 12, a variation in voltage of the node 106 shown in FIG. 12, and a variation in voltage of the node 108 shown in FIG. 12, respectively.

As shown in FIG. 16, in the delay circuit according to the sixth embodiment, the delay time t1 at the rise of signals and the delay time t2 at the fall of signals can be shorter than in the delay circuit according to the second embodiment by changing the wiring states of the PMOS and NMOS constituting the inverters $10_1$ and $10_2$.

The delay circuits according to the first to fourth embodiments have the following advantages.

Figure 19:
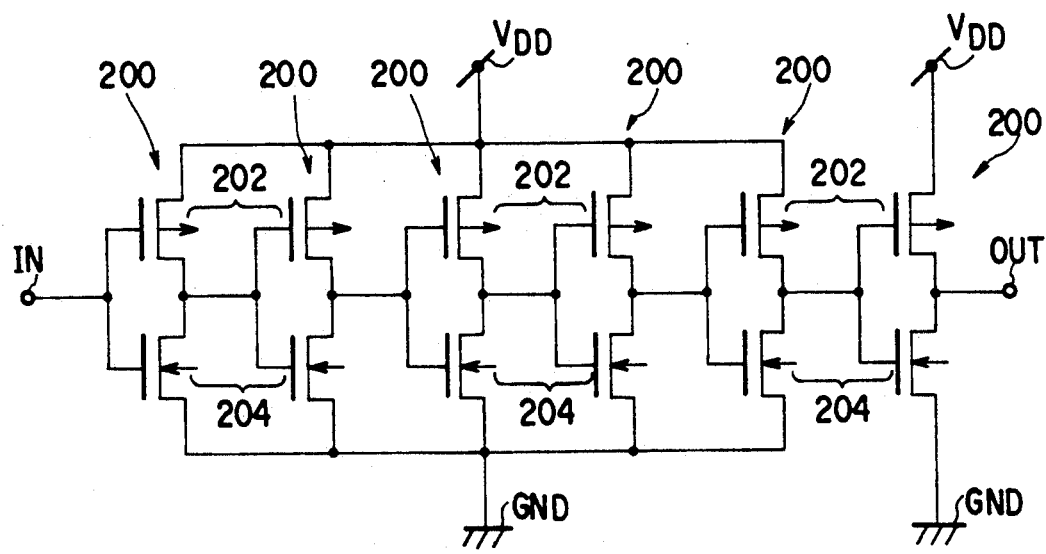
FIG. 19 is a circuit diagram of the delay circuit shown in FIG. 18.
Figure 20:
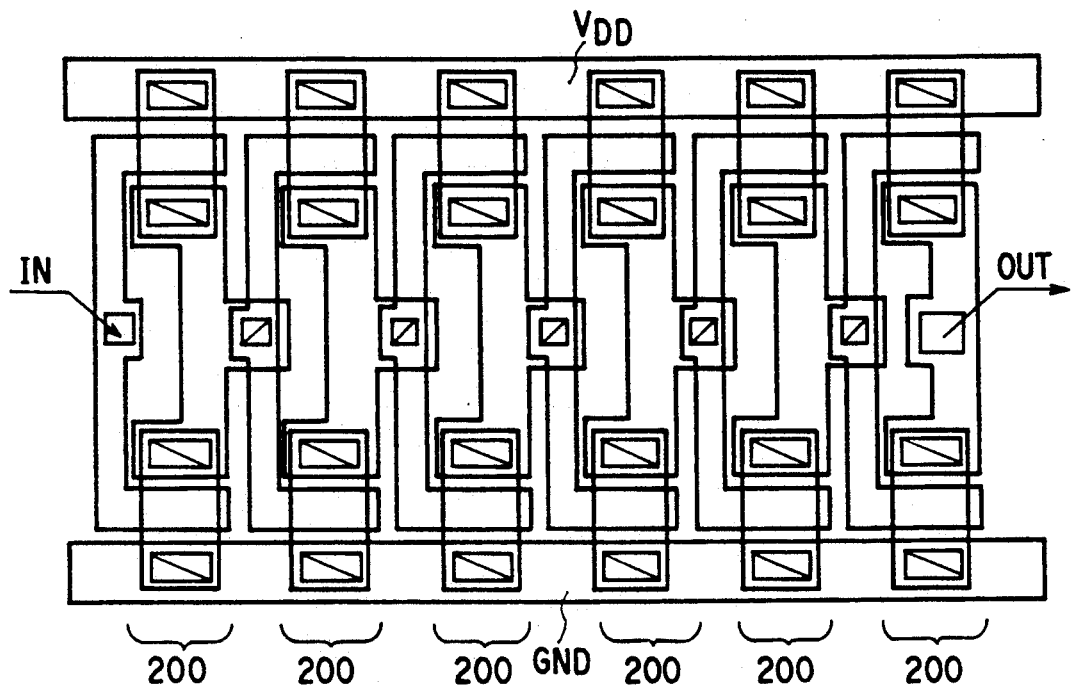
FIG. 20 is a pattern plan view of the delay circuit shown in FIG. 18.
Figure 21:
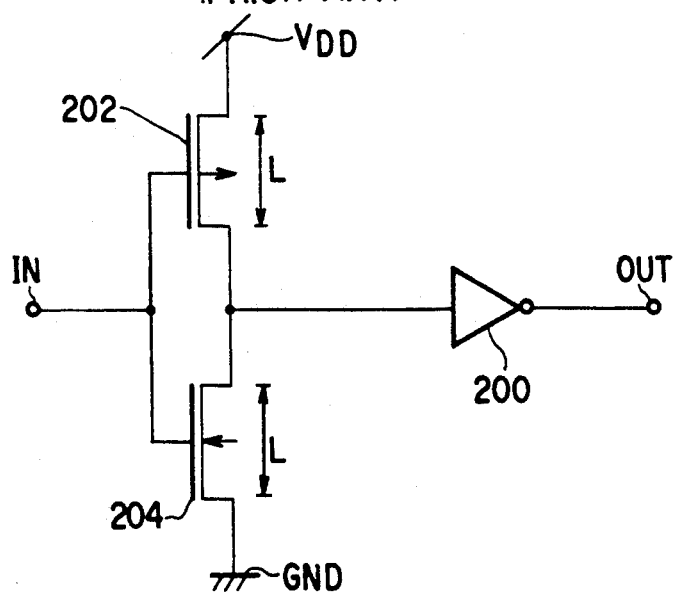
FIG. 21 is a view of another conventional delay circuit.
Figure 22:
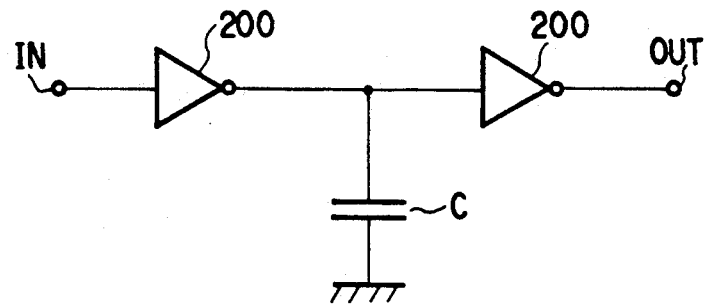
FIG. 22 is a view of still another conventional delay circuit.
Figure 23:
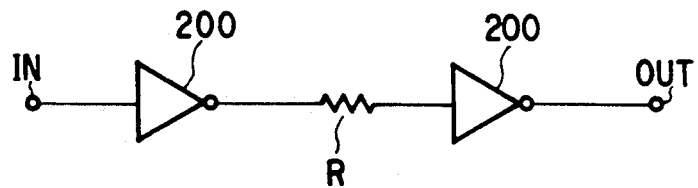
FIG. 23 is a view of yet another conventional delay circuit.

The pattern area of the delay circuit according to the first embodiment (see FIGS. 2A and 2B) is approximately 40% smaller than that of the conventional delay circuit shown in FIG. 19, though the number of elements of the former circuit is the same as that of elements of the latter circuit. Needless to say, the pattern area can be reduced in the delay circuits according to the second to sixth embodiments.

The PMOS $14_1$ to $14_{10}$ and NMOS $16_1$ to $16_{10}$ constituting the inverters $10_1$ and $10_2$ can be designed to have the same size as that of active elements constituting other circuits or that of the PMOS $18_1$ and $18_2$ and NMOS $20_1$ and $20_2$ constituting the inverters $12_1$ and $12_2$. For example, even though the gate length of the PMOS $14_1$ to $14_{10}$ and that of the NMOS $16_1$ to $16_{10}$ are set equal to that of PMOS $18_1$ and $18_2$ and that of NMOS $20_1$ and $20_2$ or that of PMOS and that of NMOS both constituting other logic circuits formed on the same semiconductor substrate, sufficient delay time can be obtained. If the MOS FETs constituting the inverters 10 and 12 are designed to have the same gate length as that of MOS FETs of other logic circuits, the rate of variation in delay time in the inverters 10 and 12 can be set equal to that in other logic circuits, even though a mask is shrunk as it is. Consequently, the design of an integrated circuit need not be changed even though a mask is shrunk, and a period of time required for developing a new integrated circuit can be shortened.

If, in the delay circuits according to the third and fourth embodiments, a mask for photoetching in the process continuing until after patterning of the gate 28 is not changed, but a mask for forming a contact hole in its succeeding process, a mask for patterning the first-layered aluminum alloy wiring layer 34, and the like are changed, delay time can be arbitrarily set. In other words, the patterns of the third and fourth embodiments (FIGS. 7, 10, 13, and 15) can be used as a sort of master slice. Since a diffusion layer pattern or a gate pattern need not be changed when delay time is changed, the design efficiency of an integrated circuit is improved.

Figure 17:
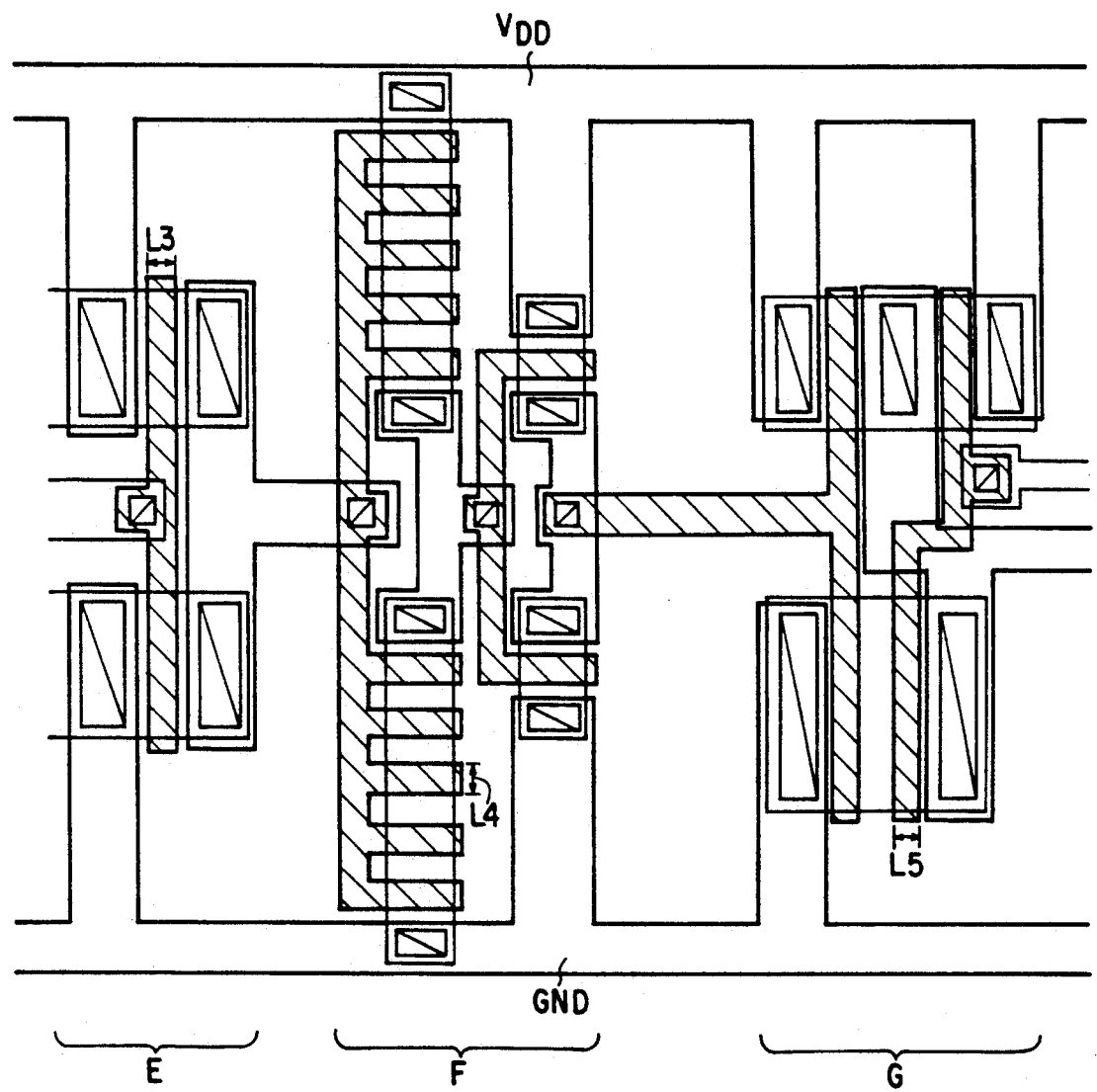
FIG. 17 is a pattern plan view showing a delay circuit according to the present invention and peripheral circuits such as logic circuits of the delay circuit.
Figure 18:
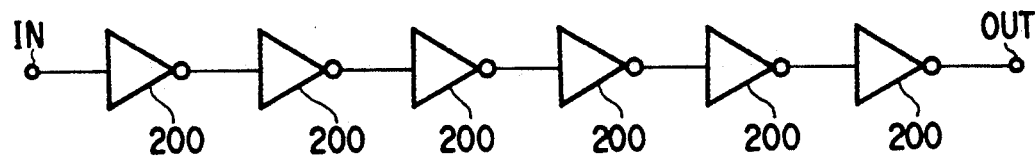
FIG. 18 is a block diagram of a conventional delay circuit.

FIG. 17 is a pattern plan view showing a delay circuit according to the present invention and peripheral circuits such as logic circuits of the delay circuit which are arranged on a chip. In FIG. 17, E indicates an inverter circuit on the stage prior to a delay circuit F, and G indicates a NAND circuit on the stage posterior to the delay circuit F. In FIG. 17, $L_3$ represents the channel length of each of MOS transistors constituting the inverter circuit E, $L_4$ denotes the channel length of each of MOS transistors constituting the delay circuit F, and $L_5$ indicates the channel length of each of MOS transistors constituting the NAND circuit G. These channel lengths are the same. The channel lengths of the MOS transistors constituting the delay circuits according to the first to sixth embodiments are the same as those of MOS transistors constituting peripheral circuits of the delay circuits, such as logic circuits.

Since none of the delay circuits according to the first to sixth embodiments include resistors or capacitors, they can be easily incorporated into an integrated circuit in which MOS FETs such as gate arrays are integrated. Therefore, the delay circuits are favorable for manufacture of integrated circuits, and a manufacturing process can be simplified.

As described above, the present invention provides a delay circuit which can reduce in pattern area per delay time, ensure its circuit operation even when dispersion of parameters of semiconductor devices occurs in the process of manufacturing semiconductor circuits, and need not conform the delay time to that of other circuits even when the shrink rate of a mask for manufacturing the semiconductor circuits is changed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A delay circuit comprising:
   an input terminal;
   a first MOS transistor series including at least two MOS transistors of a first conductivity type whose current paths are connected to one another and whose gates are connected to said input terminal;
   a second MOS transistor series including at least two MOS transistors of a second conductivity type whose current paths are connected to one another and whose gates are connected to said input terminal;

an output terminal connected to a connection point of said first and second MOS transistor series;

a first power supply serving as a current supplier to said first MOS transistor series; and a second power supply serving as a current discharger of said second MOS transistor series.

2. The delay circuit according to claim 1, further comprising a waveform shaping circuit connected to said output terminal, for shaping a waveform of a signal output therefrom.

3. The delay circuit according to claim 2, wherein said waveform shaping circuit includes at least two MOS inverters having MOS transistors of the first and second conductivity types.

4. The delay circuit according to claim 3, wherein said waveform shaping circuit includes at least two MOS inverters having MOS transistors of the first and second conductivity types.

5. The delay circuit according to claim 4, wherein said MOS transistors of said first, second, third and fourth MOS transistor series each have a gate length which is equal to that of each of the MOS transistors of said MOS inverters.

6. A delay circuit comprising:

an input terminal;

a first MOS transistor series including at least two MOS transistors of a first conductivity type whose current paths are connected to one another and whose gates are connected to said input terminal;

a second MOS transistor series including at least two MOS transistors of a second conductivity type whose current paths are connected to one another and whose gates are connected to said input terminal;

a third MOS transistor series including at least two MOS transistors of the first conductivity type whose current paths are connected to one another and whose gates are connected to a connection point of said first and second MOS transistor series;

a fourth MOS transistor series including at least two MOS transistors of the second conductivity type whose current paths are connected to one another and whose gates are connected to the connection point of said first and second MOS transistor series;

an output terminal connected to a connection point of said third and fourth MOS transistor series;

a first power supply serving as a current supplier to said first and third MOS transistor series; and a second power supply serving as a current discharger of said second and fourth MOS transistor series.

7. The delay circuit according to claim 6, further comprising a waveform shaping circuit connected to said output terminal, for shaping a waveform of a signal output therefrom.

8. The delay circuit according to claim 7, wherein said waveform shaping circuit includes at least two MOS inverters having MOS transistors of the first and second conductivity types.

9. The delay circuit according to claim 8, wherein said MOS transistors of said first and second MOS transistor series each have a gate length which is equal to that of each of the MOS transistors of said MOS inverters.

10. The delay circuit according to claim 9, wherein said MOS transistors of said first, second, third and fourth MOS transistor series each have a gate length which is equal to that of each of the MOS transistors of said MOS inverters.

11. A delay circuit comprising:

an input terminal;

a first MOS transistor series including at least two MOS transistors of a first conductivity type whose current paths are connected to one another and whose gates are connected to said input terminal;

a second MOS transistor series including at least two MOS transistors of a second conductivity type whose current paths are connected to one another and whose gates are connected to said input terminal;

a third MOS transistor series including at least two MOS transistors of the first conductivity type whose current paths are connected to one another and whose gates are connected to a connection point of said first and second MOS transistor series;

a fourth MOS transistor series including at least two MOS transistors of the second conductivity type whose current paths are connected to one another and whose gates are connected to the connection point of said first and second MOS transistor series;

an output terminal connected to a connection point of said third and fourth MOS transistor series;

a first power supply serving as a current supplier to said first and third MOS transistor series; and a second power supply serving as a current discharger of said second and fourth MOS transistor series, wherein said first power supply is connected to a connection point of any two of the current paths of the MOS transistors of said first MOS transistor series, and said second power supply is connected to a connection point of any two of the current paths of the MOS transistors of said fourth MOS transistor series.

12. The delay circuit according to claim 11, further comprising a waveform shaping circuit connected to said output terminal, for shaping a waveform of a signal output therefrom.

13. The delay circuit according to claim 12, wherein said waveform shaping circuit includes at least two MOS inverters having MOS transistors of the first and second conductivity types.

14. The delay circuit according to claim 13, wherein said MOS transistors of said first, second, third and fourth MOS transistor series each have a gate length which is equal to that of each of the MOS transistors of said MOS inverters.

15. A delay circuit comprising:

an input terminal;

a first MOS transistor series including at least two MOS transistors of a first conductivity type whose current paths are connected to one another and whose gates are connected to said input terminal;

a second MOS transistor series including at least two MOS transistors of a second conductivity type whose current paths are connected to one another and whose gates are connected to said input terminal;

a third MOS transistor series including a plurality of MOS transistors of the first conductivity type whose current paths are connected to one another, gates of some of said plurality of MOS transistors being connected to a connection point of said first and second MOS transistor series, and others of said plurality of MOS transistors being always turned on;

a fourth MOS transistor series including a plurality of MOS transistors of the second conductivity type whose current paths are connected to one another, gates of some of said plurality of MOS transistors being connected to the connection point of said first and second MOS transistor series, and others of said plurality of MOS transistors being always turned on;

an output terminal connected to a connection point of said third and fourth MOS transistor series;

a first power supply serving as a current supplier to said first and third MOS transistor series; and a second power supply serving as a current discharger of said second and fourth MOS transistor series.

16. The delay circuit according to claim 15, further comprising a waveform shaping circuit connected to said output terminal, for shaping a waveform of a signal output therefrom.

17. The delay circuit according to claim 16, wherein said waveform shaping circuit includes at least two MOS inverters having MOS transistors of the first and second conductivity types.

18. The delay circuit according to claim 17, wherein said MOS transistors of said first, second, third and fourth MOS transistor series each have a gate length which is equal to that of each of the MOS transistors of said MOS inverters.

* * * * *